United States Patent [19]

Itoh et al.

[11] 4,402,066
[45] Aug. 30, 1983

[54] SEMICONDUCTOR MEMORY CIRCUIT

[75] Inventors: Hideo Itoh, Kawasaki; Hiroshi Shimada, Tokyo, both of Japan

[73] Assignee: Fujitsu Limited, Kawasaki, Japan

[21] Appl. No.: 234,716

[22] Filed: Feb. 17, 1981

[30] Foreign Application Priority Data

Feb. 16, 1980 [JP] Japan .................................. 55-18019

[51] Int. Cl.³ .............................................. G11C 7/00
[52] U.S. Cl. .................................... 365/189; 365/203
[58] Field of Search ............... 365/154, 156, 189, 190, 365/202, 203, 205

[56] References Cited

U.S. PATENT DOCUMENTS 4,099,265  7/1978  Abe ...................................... 365/190
4,161,040  7/1979  Satoh ................................... 365/203

Primary Examiner—Joseph A. Popek
Attorney, Agent, or Firm—Staas & Halsey

[57] ABSTRACT

A semiconductor memory circuit having reduced read-access time and comprising a plurality of first and second common line pairs, each including a bit line and a data line connected in series is disclosed. Conventional static RAM memory cells are connected between each of the bit line pairs. A write-control circuit and sense amplifier are connected between each of the data bus pairs. At least one bypassing transistor is connected between each of the first and second common line pairs for conducting current between each of the lines of the common line pairs, thus reducing the read-access time.

11 Claims, 10 Drawing Figures

SEMICONDUCTOR MEMORY CIRCUIT

The present invention relates to a semiconductor memory circuit and, more particularly, to a semiconductor memory circuit which is applied to a static RAM.

As is widely known, the static RAM is a random-access memory in which data is stored in a conventional bistable flip-flop and need not be refreshed. The present invention refers to the static RAM system and, to be more specific, refers to a technique for shortening a read-access time performed in the system. Generally, the system includes therein a great number of static RAM cells. The static RAM cells are arranged along each of many bit-line pairs. The bit lines are arranged in parallel with each other.

In each of the bit-line pairs, each of the memory cells (static RAM cells) has respective data to be stored such as the logic "1" or "0". The data can be rewritten through a write operation. Regarding the read-access time, a defect exists in the system in the particular case where, first, data of one memory cell is rewritten and, next, data of another memory cell is read, in which case the former memory cell and the latter memory cell are of the same bit-line pair and the logic of the latter data is the inverse logic of the former data, such as logic "1"→"0" or logic "0"→"1". In this particular case, the defect exists in that the read-access time of the latter data becomes relatively long (the reason for this will be explained hereinafter). Consequently, it is required to realize a static RAM system in which the read-access time can be shortened more than usual in any access mode.

Therefore, it is an object of the present invention to provide a semiconductor memory circuit which can shorten the read-access time of a static RAM system and, accordingly a high speed static RAM system can be obtained.

The present invention will be more apparent from the ensuing description with reference to the accompanying drawings wherein.

Figure 1:
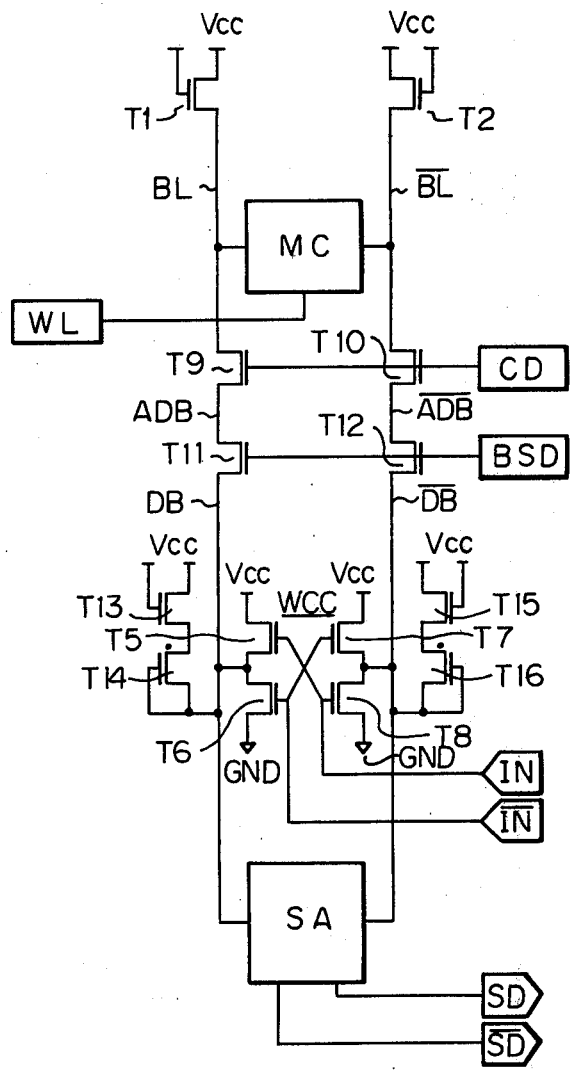
FIG. 1 illustrates a circuit diagram of a conventional static RAM system.

FIG. 1 illustrates a circuit diagram of a conventional static RAM system. In FIG. 1, the reference symbols BL and $\overline{BL}$ denote one of the bit-line pairs for constructing the static RAM. One end of each of the bit lines BL and $\overline{BL}$ is connected to a power source having the voltage level of Vcc, via load transistors T1 and T2, respectively. A plurality of static RAM cells are arranged in parallel between the bit lines BL and $\overline{BL}$. However, only one memory cell MC is representatively illustrated in this Figure. A desired memory cell MC to be accessed is selected by a selection signal transmitted via a word line. However, only one word line WL is illustrated in this Figure. The bit lines BL and $\overline{BL}$ are connected to an auxiliary data-bus pair, respectively, via field-effect transistors T9 and T10. The auxiliary data-bus pair is comprised of auxiliary data buses ADB and $\overline{ADB}$. The transistors T9 and T10 are turned ON or OFF by a column decoder CD. The auxiliary data-bus pair (ADB, $\overline{ADB}$) is connected to a data-bus pair, via field-effect transistors T11 and T12. The transistors T11 and T12 are turned ON or OFF by a block-selection decoder BSD. The data-bus pair is comprised of data buses DB and $\overline{DB}$.

Figure 2:
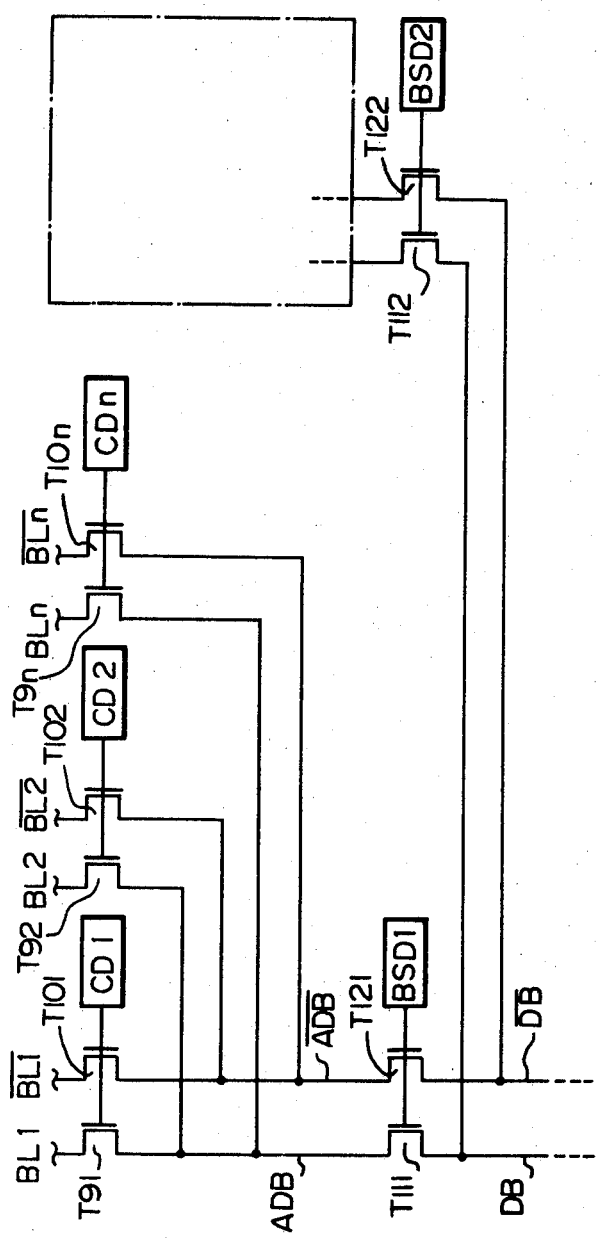
FIG. 2 illustrates an actual arrangement of members T9, T10, CD, T11, T12, BSD, $\overline{ADB}$, ADB, $\overline{DB}$, DB shown in FIG. 1 and their neighboring members.

The column decoder CD is activated when a corresponding bit-line pair (BL, $\overline{BL}$) is to be selected. The block-selection decoder BSD is activated when a specified group of bit-line pairs is to be selected. However, it should be understood that the decoder BSD (and also the transistors T11 and T12) is required when a large capacity static RAM system is constructed. FIG. 2 illustrates an actual arrangement of members T9, T10, CD, T11, T12, BSD, $\overline{ADB}$, ADB, $\overline{DB}$, DB shown in FIG. 1 and their neighboring members. In FIG. 2, each of the column decoders CD1, CD2 . . . CDn is identical to the column decoder CD of FIG. 1. Each of block-selection decoders BSD1, BSD2 and so on is identical to the block-selection decoder BSD of FIG. 1. The decoder BSD1 is activated only when any one of the bit-line pairs (BL1, $\overline{BL1}$), (BL2, $\overline{BL2}$) . . . (BLn, $\overline{BLn}$) are to be selected. It should be understood that the arrangement shown in FIG. 2 is not important in understanding the present invention.

Returning to FIG. 1, the data buses DB and $\overline{DB}$ are connected to a write-control circuit WCC which is comprised of field-effect transistors T5, T6, T7 and T8. The data buses DB and $\overline{DB}$ are further connected to a sense amplifier SA. As is well known, the sense amplifier SA is an amplifier which detects differential-input data, stored in the selected memory cell, and produces sensing data SD and also inverted sensing data $\overline{SD}$.

The above-mentioned write-control circuit WCC receives, under a write-operation mode, input data IN and inverted input data $\overline{IN}$, at the gates of the transistors T5, T6, T7 and T8. When the input data IN, having the logic "1", is applied to the gates of the transistors T5 and T8, these transistors T5 and T8 are ON. Since the transistor T8 is ON, the levels of the data bus $\overline{DB}$, the auxiliary data bus ADB and the bit line $\overline{BL}$ are pulled down toward the ground level GND. In this case, when the input data $\overline{IN}$, having the logic "0" being inverted logic "1" of said input data IN, is applied to the gates of the transistors T6 and T7. Thus, the transistors T6 and T7 are OFF. Since the transistor T6 is OFF, but the transistor T5 is ON, the levels of the data bus DB, the auxiliary data bus ADB and the bit line BL are pulled up toward high level H by means of the transistor T5 which is now ON and connected to the power source of Vcc. Said high level H is substantially the same as (Vcc−Vth), that is $H=Vcc-Vth$, where the Vth denotes a threshold voltage of the transistor T5. As a result, data having the logic "1" is written in the selected memory cell MC, under the write-operation mode.

In FIG. 1, field-effect transistors T13 and T14 act as a voltage stabilizer with respect to the data bus DB. Field-effect transistors T15 and T16 also act as a voltage stabilizer with respect to the bus $\overline{DB}$. If no such voltage stabilizers are employed, the voltage level of the data bus DB and the voltage of the data bus $\overline{DB}$ are left in a floating status and, thus the voltage level cannot be stabilized. However, if employed, the voltage stabilizer can fix the voltage level of the corresponding data bus (DB or $\overline{DB}$) at the level of Vcc−Vth, when the data bus transfers the logic "1".

Figure 3:
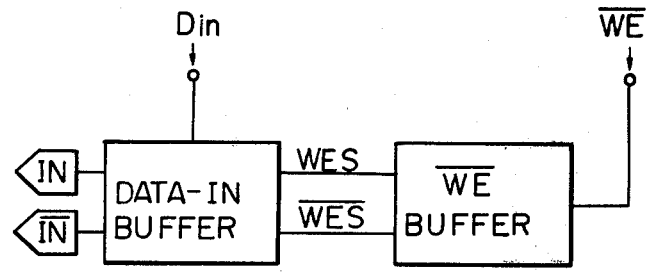
FIG. 3 is a block diagram of a conventional means for producing the input data IN and $\overline{IN}$.

Regarding the input data IN and $\overline{IN}$ of FIG. 1, these data are produced from a data-in buffer. FIG. 3 is a block diagram of a conventional means for producing the input data IN and $\overline{IN}$ of FIG. 1. In FIG. 3, the input data IN and $\overline{IN}$ are produced from the data-in buffer (DATA-IN BUFFER), under the write-operation mode. The data-in buffer receives an external input data Din to be written in the selected memory cell and controlled by write-enable signals WES and $\overline{WES}$ supplied from a write-enable buffer (WE BUFFER). The write-enable buffer is activated by an external write-enable command WE when the write operation is executed.

Figure 4:
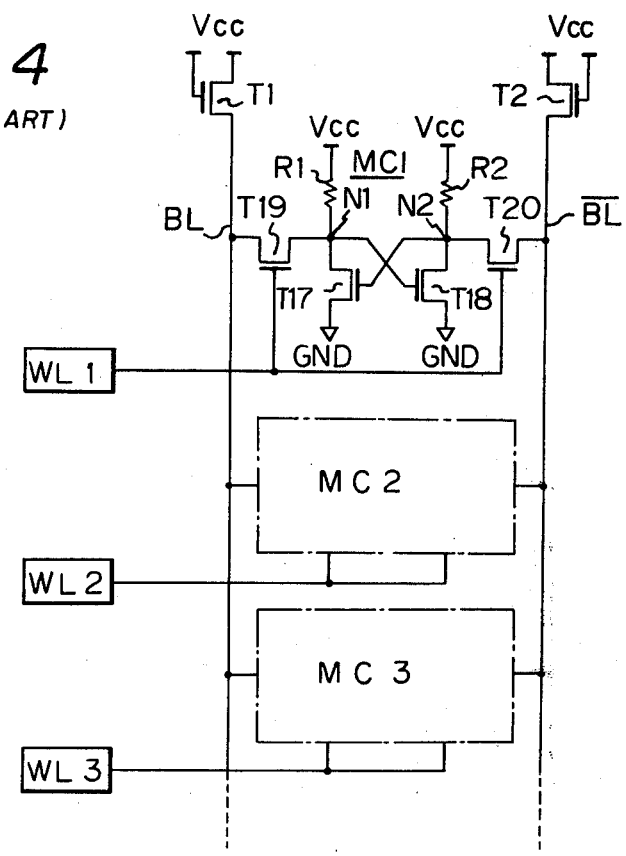
FIG. 4 is a detailed circuit diagram of a conventional memory cell MC1 corresponding to the memory cell MC shown in FIG. 1.

FIG. 4 is a detailed circuit diagram of a conventional memory cell MC1 corresponding to the memory cell MC shown in FIG. 1. In FIG. 4, the symbols T1, T2, BL, $\overline{BL}$, MC, WL and Vcc have already been explained. A plurality of the memory cells MC1, MC2, MC3 and so on are arranged between the bit lines BL and $\overline{BL}$, the memory cells have the same circuit construction. In the memory cell MC1, the bistable flip-flop is comprised of field-effect transistors T19 and T20 having load resistors R1 and R2, respectively. The bistable flip-flop (T17, T18, R1, R2) is connected, on one hand, to the bit line BL via a transfer-gate transistor T19 and, on the other hand, to the bit line $\overline{BL}$ via a transfer-gate transistor T20. Under the write-operation mode, taking as an example, a case where the data having a logic "1" is to be written in the memory cell MC1, first, the corresponding word line WL1 transfers the selection signal and accordingly, the transfer-gate transistors T19 and T20 are turned ON, then, the bit line $\overline{BL}$ is made the level of the logic "0" and the bit line BL is made the level of the logic "1" by means of the write-control circuit WCC shown in FIG. 1. In this case, the level of a portion N2 becomes the logic "0" and the level of a portion N1 becomes the logic "1" and, accordingly the transistor T17 turns OFF and the transistor T18 turns ON. Therefore, the level of the portion N1 is fixed to the logic "1" and the level of the portion N2 is fixed to the logic "0". Thus, the data having the logic "1" is written in the memory cell MC1. Similarly, data having a logic "0" can be written in the memory cell MC2 through a sequence similar to that, mentioned above regarding the memory cell MC1.

As previously mentioned, regarding the read-access time, the defect exists in the system in a particular case where, for example, first, the data of the memory cell MC1 is rewritten from the logic "0" to the logic "1" and, next, the data of another memory cell MC2, having the logic "0", is to be read. That is, two logic levels, inverted with respect to each other, appear sequentially on the same bit-line pair (BL, $\overline{BL}$). In such a case, first, the input data IN (FIG. 1) having the logic "1" and the input data $\overline{IN}$ (FIG. 1) having the logic "0" are, respectively, applied to the transistors T5, T8 (FIG. 1) and the transistors T6, T7 (FIG. 1). Consequently, the level of the bit line BL is pulled up toward the logic "1", while the level of the bit line $\overline{BL}$ is pulled down toward the logic "0". Thus, in FIG. 4, the level of the portion N2 is pulled down toward the logic "0" and, accordingly the transistor T17 can no longer maintain the ON status. Then the level of the portion N1 increases toward the logic "1". Therefore, the transistor T18 is changed to ON and, accordingly the level of the portion N2 is fixed to the logic "0" and at the same time the transistor T17 is left in the OFF status. Thus, the data of the memory cell MC1 is changed from the logic "0" to the logic "1".

Figure 5:
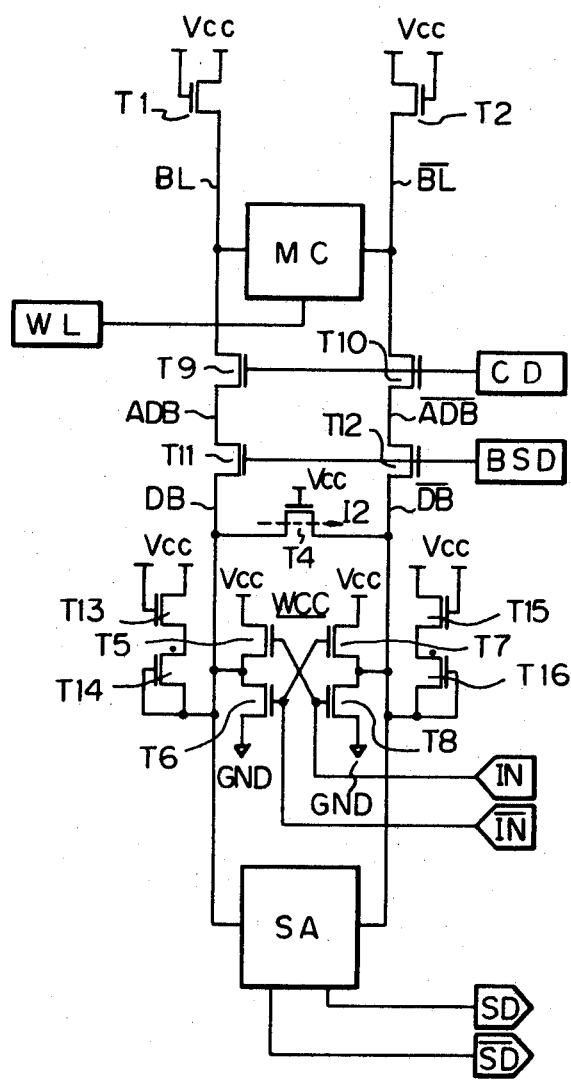
FIG. 5 illustrates a circuit diagram of a first static RAM system, according to the present invention.
Figure 6:
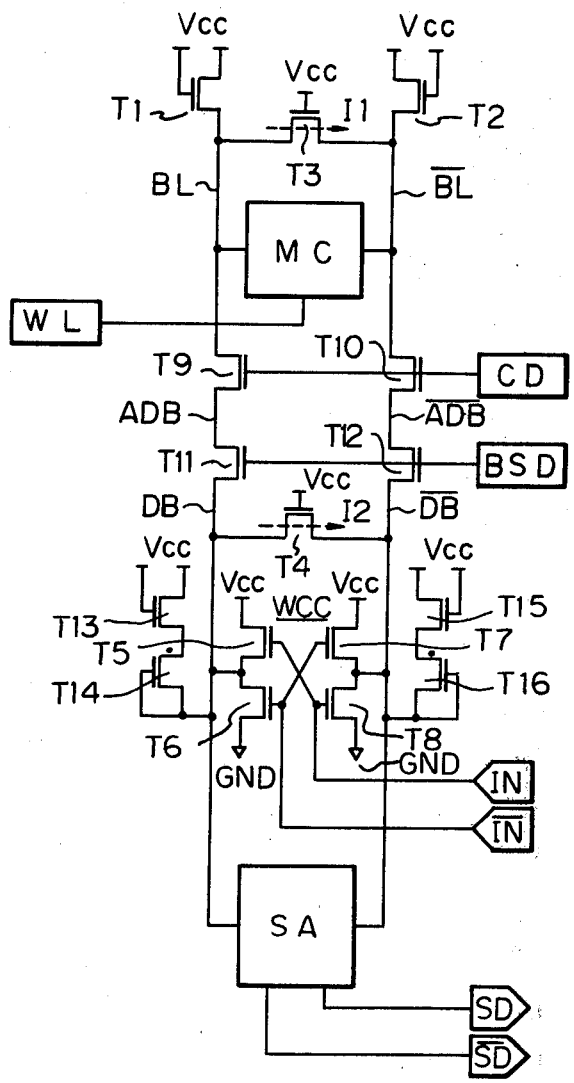
FIG. 6 illustrates a circuit diagram of a second static RAM system, according to the present invention.

According to the above-mentioned example, next, the data of the memory cell MC2 is read, by supplying the selection signal to the word line WL2, from the sense amplifier SA, as the sensing data SD, $\overline{SD}$ shown in FIG. 1, after the elapse of the read-access time. If the level of the bit line $\overline{BL}$ changes immediately from the logic "1" to the logic "0" and simultaneously if the level of the bit line BL changes immediately from the logic "0" to the logic "1", the read-access time would be very short. However, in actual operation, the level of the bit line $\overline{BL}$ does not change immediately from the logic "0" to the logic "1". This is because, referring to FIG. 1, the operation for charging the bit line $\overline{BL}$ by the power source (Vcc), via the load transistor T2 and the voltage stabilizer (T15, T16), cannot be completed in a short time. Also, since the level of the bit line BL has been held at the level of the logic "1" from when the data of the logic "1", that is the level of (Vcc−Vth), was written in the memory cell MC1, no discharging path of the electric charges exists. Thus, since the level of the bit line $\overline{BL}$ does not change immediately and the level of the bit line BL is held as it is, it is not easy to shorten the read-access time. In order to overcome the above-mentioned defect in the read-access time, at least one by-passing means is introduced between a first common line, including the bit line $\overline{BL}$, the auxiliary data bus $\overline{ADB}$ and the data bus $\overline{DB}$, and a second common line, including the bit line BL, the auxiliary data bus ADB and the data bus DB, as shown in FIG. 5 and FIG. 6. FIG. 5 illustrates a circuit diagram of a first static RAM system, according to the present invention. FIG. 6 illustrates a circuit diagram of a second static RAM system, according to the present invention. The operation of the circuits shown in FIGS. 1 and 6, will be clarified with reference to FIG. 7.

Figure 7:
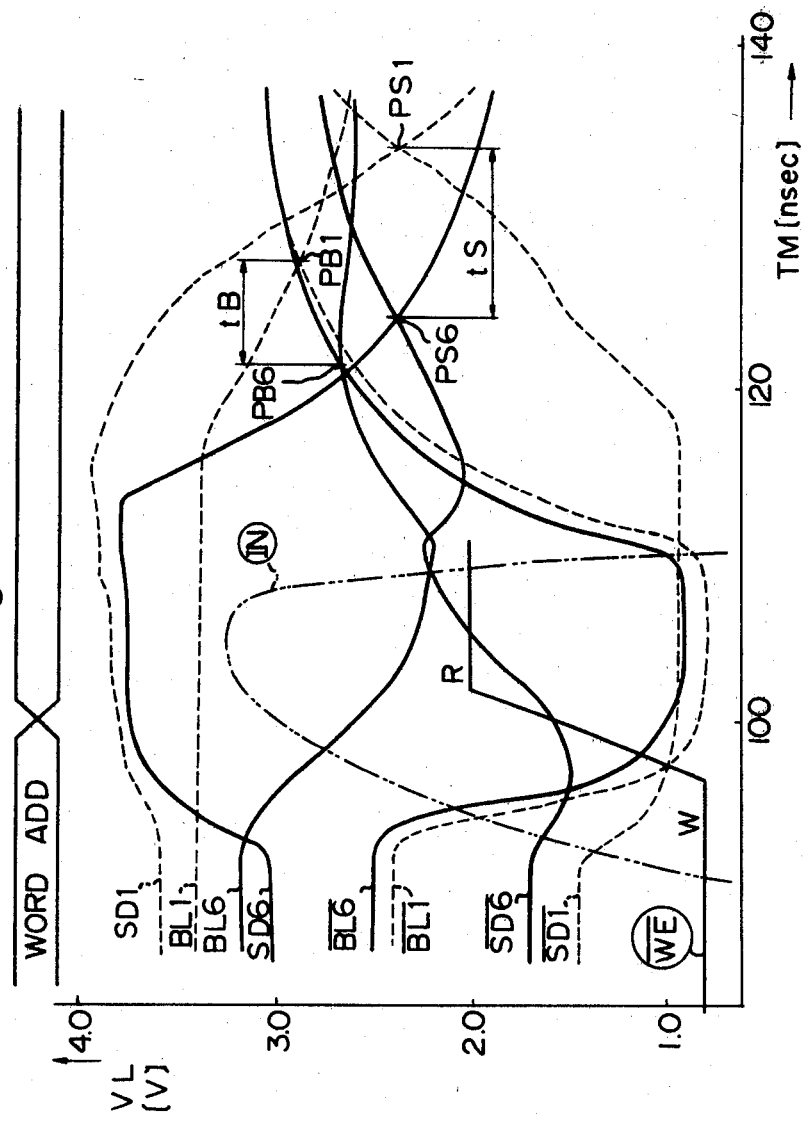
FIG. 7 depicts a graph, used for explaining the operations of the circuits shown in FIG. 1 and FIG. 6.

FIG. 7 depicts a graph, used for explaining the operation of the circuits shown in FIG. 1 and FIG. 6. The abscissa of the graph indicates a time TM in nsec and the ordinate thereof indicates a voltage level VL in volt. The variations of the voltage level developed on the bit lines BL and $\overline{BL}$, shown in FIG. 1, are indicated by dotted lines BL1 and $\overline{BL1}$. The usual access time is defined by a crossover point PB1 between the lines BL1 and $\overline{BL1}$. The time when the crossover point PB1 occurs is later than the time when the crossover point PB1 occurs under conditions in which, first, the data of the memory cell MC1, having the logic "1", is read (not written) and then, the data of the memory cell MC2, having the logic "0", is read. It should be noted that the read operation, regarding the memory cell MC2, can be started long after the time the crossover point PB1 occurs. It is, of course, that if the occurrence of the crossover point PB1 is delayed, the occurrence of the crossover point, between the output of the sensing data SD and the output of the sensing data $\overline{SD}$ from the sense amplifier SA (see FIG. 1), is also delayed. Which can be seen from crossover point PS1 between the variation of the sensing data SD, indicated by a dotted line SD1 and a variation of the sensing data $\overline{SD}$, indicated by a dotted line $\overline{SD1}$. In the graph, a chain dotted line IN indicates the variation of the voltage level of the input data IN, supplied from the data-in buffer shown in FIG. 3, which input data IN was used to rewrite the data of the memory cell MC1 from the logic "0" to the logic "1". Further, in the graph, a solid line $\overline{WE}$ indicates the variation of the external write-enable command $\overline{WE}$ shown in FIG. 3. The logic "0" of the command $\overline{WE}$ represents a command for starting the write operation (W) and, while, the logic "1" thereof represents a command for starting the read operation (R). The variation of WORD ADD, indicated on the top of the graph, shows a change from one word address, used in the write operation, to the following word address, used in the read operation (refer to the aforesaid selection signals transferred on the word lines WL1 and WL2, respectively). It should be understood that the phase of the external write-enable command $\overline{WE}$ advances compared to the phases of the aforesaid voltage signals due to the existence of transmission time of the signal $\overline{WE}$ through the write-enable buffer and the data-in buffer, both shown in FIG. 3.

As seen from FIG. 6, the bypassing means are introduced in the static RAM system. Each of the bypassing means functions to flow bypassing current from either one of said first and second common lines (BL, ADB, DB and $\overline{BL}$, $\overline{ADB}$, $\overline{DB}$), having the logic "1", to the other common line, having the logic "0". The amplitude of the bypassing current should not be large enough to electrically short the first and second common lines and further should not be larger than the current, to be flowing from the common line, having the logic "1", into the bistable flip-flop in each memory cell. If the bypassing current is larger than the current flowing into the bistable flip-flop, a normal write operation cannot be expected. Accordingly, it is preferable to fabricate the bypassing means by a resistor having a suitable resistance value for satisfying the above-mentioned function. In FIG. 6 (and also FIG. 5), the resistors, acting as the bypassing means, are made of field-effect transistors T3 and T4. The bypassing currents, flowing through the transistors T3 and T4, are indicated, respectively by the reference symbols I1 and I2. In FIGS. 5 and 6, the transistor T4 is connected, at its source and drain, to the data buses DB and $\overline{DB}$. In FIG. 6, the transistor T3 is connected, at its source and drain, to the bit lines BL and $\overline{BL}$. Since the gate of each of the transistors T3 and T4 receives the voltage level Vcc of the power source, these transistors T3 and T4 are always ON, regardless of whether the system is operated under the write-operation mode or the read-operation mode.

When the data, having the logic "1", is written in the memory cell MC1, first, the level of the first common line, having the logic "1", is higher than that of the second common line, having the logic "0". However, next, the levels of the first and second common lines vary so as to be the same level, due to the flows of the bypassing currents I1 and I2, via the transistors T3 and T4. Consequently, the variations of the voltage level developed on the bit line BL (also the buses ADB and DB) and $\overline{BL}$ (also the buses $\overline{ADB}$ and $\overline{DB}$), shown in FIG. 6, are indicated by solid lines BL6 and $\overline{BL6}$ in FIG. 7. The variations of the voltage level of the sensing data SD and $\overline{SD}$ from the sense amplifier SA, shown in FIG. 6, are indicated by solid lines SD6 and $\overline{SD6}$, respectively in FIG. 7. As seen from the graph of FIG. 7, the variation of the voltage level of the bit line BL (ADB, DB) of the present invention, indicated by the solid line BL6, is analogous to that of the bit line BL (ADB, DB) of the prior art, indicated by the dotted line BL1, except that the level of the former variation (BL6) is, as a whole, slightly smaller than that of the latter variation (BL1) due to the presence of the voltage drop across the transistors T3 and T4, induced by the bypassing currents I1 and I2, respectively. Contrary to this, the variation of the voltage level of the bit line $\overline{BL}$ ($\overline{ADB}$, $\overline{DB}$) of the present invention, indicated by the solid line $\overline{BL6}$, is far different from that of the bit line $\overline{BL}$ ($\overline{ADB}$, $\overline{DB}$) of the prior art, indicated by the dotted line $\overline{BL1}$. That is, the level of $\overline{BL6}$, first, drops sharply, compared to the corresponding level of $\overline{BL1}$, during the time 90 nsec through 110 nsec, because the bypassing currents I1 and I2 flow from the first common line (BL, ADB, DB) to the second common line ($\overline{BL}$, $\overline{ADB}$, $\overline{DB}$). Then, the level of $\overline{BL6}$ increases during the time 110 nsec through 120 nsec, because of the supply of a current from the voltage stabilizer T13 and T14. Finally, the level of $\overline{BL6}$ is saturated at the level of the logic "0" after the time 120 nsec, due to the appearance of the data, having the logic "0", stored in the memory cell MC2. The memory cell MC2 is to be selected after the memory cell MC1. In this case, the read operation for the memory cell MC2 can be started after a crossover point PB6 which occurs between the variations of the lines BL6 and $\overline{BL6}$. It should be recognized that the occurrence of the point PB6 is earlier than the point PB1 by a time tB (shown in the graph) and, accordingly, the read-access time may be shortened more than usual. That is, if the crossover point, between the first common line (BL, ADB, DB) and the second common line ($\overline{BL}$, $\overline{ADB}$, $\overline{DB}$), occurs fast, the crossover point, between the sensing data SD and $\overline{SD}$, also occurs fast. Regarding the sensing data SD and $\overline{SD}$, the variations of the sensing data SD and $\overline{SD}$ of the present invention are indicated by solid lines SD6 and $\overline{SD6}$. The crossover point between the lines SD6 and $\overline{SD6}$ is represented by the symbol PS6. The point PS6 of the present invention occurs sooner than the occurrence of the point PS1 of the prior art by a time tS (shown in the graph). As a result, the read-access time can be shortened.

Regarding the configuration of the line SD6, which configuration is obtained from the difference between the levels of BL6 and $\overline{BL6}$. When the difference therebetween is large, the level of the SD6 increases, but if it is small, the level of the line SD6 decreases. Regarding the configuration of the line $\overline{SD6}$, which configuration is derived from an inversion of the line $\overline{BL6}$. That is if the configuration of the line $\overline{BL6}$ is ∪-shaped, the configuration of the line $\overline{SD6}$ is Ω-shaped, and vice versa.

The difference between the first static RAM system of FIG. 5 and the second static RAM system of FIG. 6 is as follows. The transistor T3 is connected to each bit-line pair. Accordingly, in a large capacity static RAM system, since the number of the bit-line pairs is large, it is not preferable to employ so many transistors T3 in such large capacity static RAM system from an economical view point. In the large capacity static RAM system, generally, the block-selection decoders BSD1, BSD2 . . . are utilized and, accordingly, the transistors T3 are not required, but only the transistors T4 should be employed.

In the above-mentioned explanation, the data of the logic "1"38 is first written in the memory cell MC1 and then the data of the logic "0" is read from the memory cell MC2. However, it should be understood that the present invention is also applicable in a case where, first, the data of the logic "0" is written in the memory cell MC1 and then the data having the logic "1" is read from the memory cell MC2. According to the latter case, the reference symbols of FIG. 7 should be rewritten, that is, the reference symbols SD1, BL1, BL6, SD6, $\overline{BL6}$, $\overline{BL1}$, $\overline{SD6}$, $\overline{SD1}$ and $\overline{IN}$ should be changed, respectively, to $\overline{SD1}$, $\overline{BL1}$, $\overline{BL6}$, $\overline{SD6}$, BL6, BL1, SD6, SD1 and IN.

Figure 8:
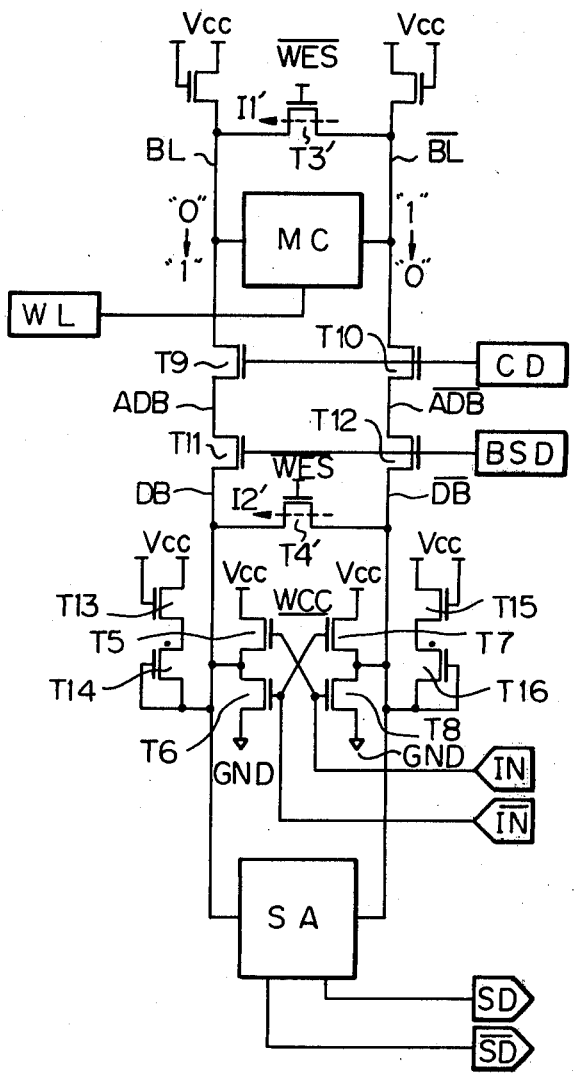
FIG. 8 illustrates a circuit diagram of a third static RAM system, according to the present invention.

Next, a third static RAM system, a fourth static RAM system and a fifth static RAM system will be explained. In the aforementioned first and second static RAM systems, the explanations were made by taking, as an example, a case where, first, some data is written in the memory cell MC1 and then some data is read from the memory cell MC2. However, the present invention can also be applicable to a case where, first, some data is read from the memory cell MC1 and then some data is read from the memory cell MC2, in which the data have invert logic with respect to each other. In such a case, the read-access time for the memory cell MC2 can also be shortened, according to the present invention. Taking as an example, a case where first, the data of the logic "0" is read from the memory cell MC1 and then the data of the logic "1" is read from the memory cell MC2, the changes of the voltage levels, developed on the first and second common lines are schematically illustrated in FIG. 8. FIG. 8 illustrates a circuit diagram of a third static RAM system, according to the present invention. In FIG. 8, elements having the same reference symbols as those of aforementioned figures, are identical to each other. The above-mentioned changes of logic levels, on the first and second common lines, are schematically illustrated, in FIG. 8, as "0"→"1" and "1"→"0". If the changes, "0"→"1" and "1"→"0", are performed very quickly, the read-access time can necessarily be shortened. In order to achieve such quick changes of the logic, the previously mentioned bypassing means are introduced between the first and second common lines. In the example, the bypassing means are made of field-effect transistors T3' and T4'. When the above-mentioned changes of the logic are performed, the electric charges along the first common line (BL, ADB, DB) must be accumulated quickly and simultaneously the electric charges along the second common line ($\overline{BL}$, $\overline{ADB}$, $\overline{DB}$) must be taken away quickly so as to shorten the read-access time. The quick movement of the electric charges can be achieved by means of the transistors T3' and T4' (see currents I1' and I2'). The same is true with respect to a case where, first, the data of the logic "1" is read from the cell MC1 and then the data of the logic "0" is read from the cell MC2.

Figure 9:
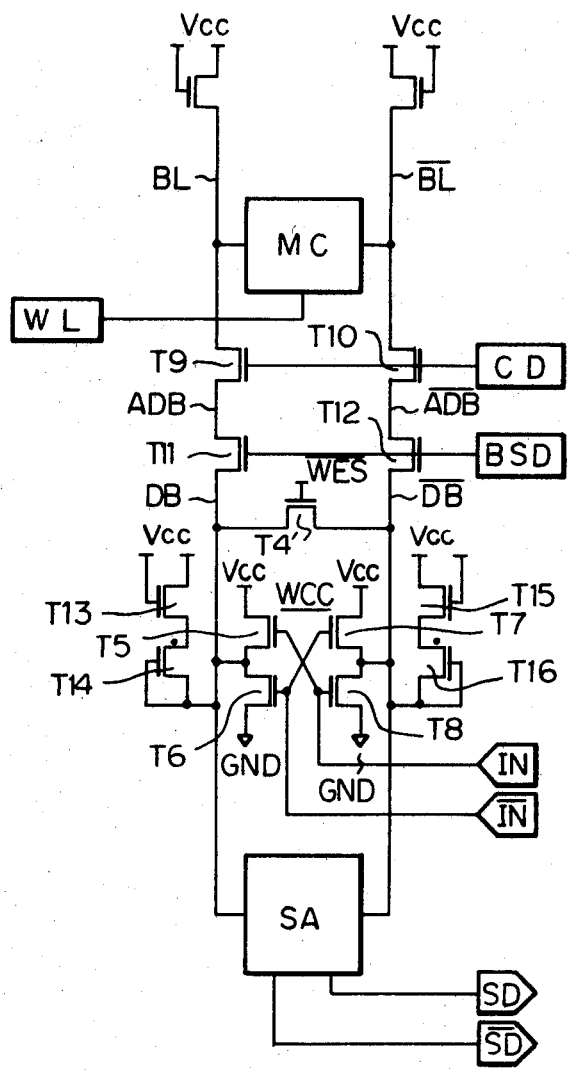
FIG. 9 illustrates a circuit diagram of a fourth static RAM system, according to the present invention; and, FIG. 10 illustrates a circuit diagram of a fifth static RAM system, according to the present invention.

The bypassing currents I1' and I2' are very high in amplitude and, accordingly, the transistors T3' and T4' must be turned ON only when the read operation is conducted. In order to satisfy this, the transistors T3' and T4' receive, at their gates, the write-enable signals $\overline{WES}$ (refer to FIG. 3). When the read operation is commanded to start, the level of the signal WES becomes the logic "1" and the signal $\overline{WES}$ turns on transistors T3' and T4'. If the transistors T3' and T4' are always ON, as are the transistors T3 and T4, it is difficult to always quarantee the correctness of the write operation, because the amplitudes of the bypassing currents I1' and I2' are considerably larger than the bypassing currents I1 and I2. In a large capacity static RAM system, since the number of the bit-line pairs is large, it is not preferable to employ so many transistors T3' in such large capacity static RAM system from an economical view point. Accordingly, the transistors T3' can be cancelled as shown in FIG. 9. FIG. 9 illustrates a circuit diagram of a fourth static RAM system, according to the present invention.

The transistors T3, T3', T4 and T4' can exist, simultaneously, in the same RAM system, by connecting the transistors T3 and T3' in parallel and also the transistors T4 and T4' in parallel.

Figure 10:
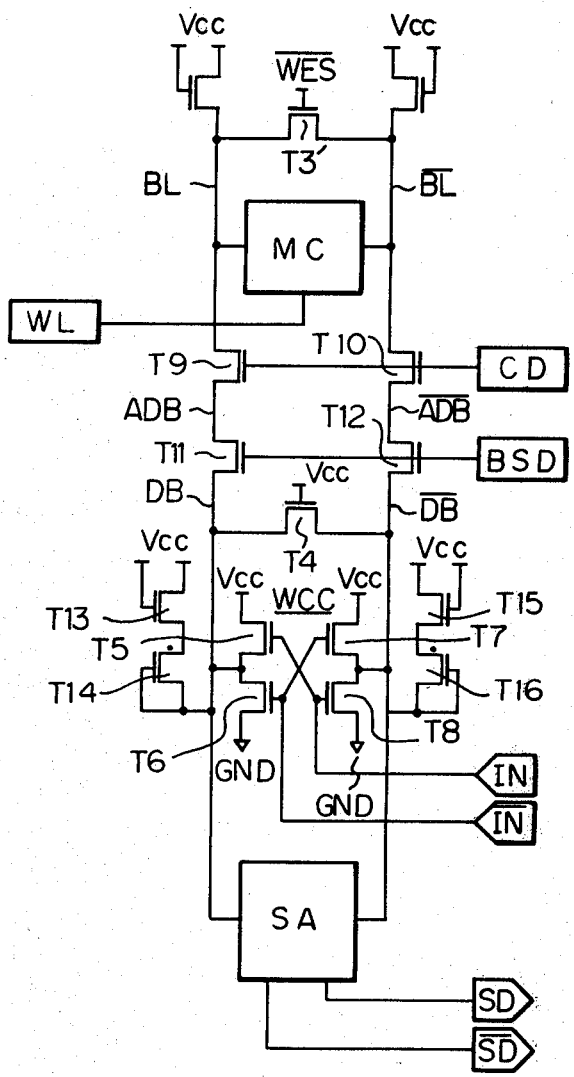

The most preferable embodiment is illustrated in FIG. 10. FIG. 10 illustrates a circuit diagram of the fifth static RAM system, according to the present invention. In FIG. 10, the transistor T3' is effective for shortening the read-access time in a "read→read" sequence mode, while the transistor T4 is effective for shortening the read-access time in a "write→read" sequence mode, and more particularly, in both modes, when the former data and the latter data have inverted logic levels with respect to each other.

As explained in detail, the present invention improves the read-access time in the static RAM system.

We claim:

1. A semiconductor memory circuit comprising:
a plurality of first common line and second common line pairs, each of said first and second common lines including at least a bit line and a data bus connected in series;
a plurality of static RAM type memory cells, each cell absorbing a fixed current, having a read cycle, a write cycle, and being connected between a corresponding one of said bit line pairs;
a write-control circuit connected between each of said data bus pairs;
a sense amplifier connected between each of said data bus pairs, for producing read data responsive to data sensed from each of said data bus pairs; and
a plurality of bypassing transistors operatively connected between the corresponding first and second common lines of respective said pairs thereof, for conducting bypassing current between said corresponding first and second common lines of the respective said pairs such that said bypassing current is less than said fixed current, each of said bypassing transistors being continuously conductive at least during said read cycle.

2. A semiconductor memory circuit as set forth in claim 1, wherein said plurality of bypassing transistors is operatively connected between said data buses of said corresponding first and second common lines of said respective pairs.

3. A semiconductor memory circuit as set forth in claim 1, wherein a first portion of the plurality of bypassing transistors is operatively connected between said corresponding data bus pairs, and a second portion of the plurality of bypassing transistors is operatively connected between said corresponding bit line pairs.

4. A semiconductor memory circuit as set forth in claim 1, 2 or 3, wherein each bypassing transistor conducts when data having a first logic level is written into one of said memory cells and then data, having the inversion of said first logic level and stored in another memory cell, is read.

5. A semiconductor memory circuit as set forth in claim 4, further comprising a power source for driving the semiconductor memory circuit, and wherein each of said bypassing transistors comprises a field-effect transistor connected, at its source and drain, to said corresponding first and second common lines, respectively, and receives, at its gate, the voltage supplied from said power source.

6. A semiconductor memory circuit as set forth in claim 1, 2 or 3, wherein the plurality of bypassing transistors comprises auxiliary bypassing transistors operatively connected between corresponding said first and second common lines of said respective pairs, for conducting bypassing current between said corresponding first and second common lines of the respective said pairs, each auxiliary bypassing transistor conducting when data having a first logic level is read from one of said memory cells and then data, having the inversion of said first logic level is read from another memory cell.

7. A semiconductor memory circuit as set forth in claim 6, wherein said auxiliary bypassing transistors are operatively connected between said data busses of said corresponding first and second common lines of said respective pairs.

8. A semiconductor memory circuit as set forth in claim 6, wherein, for each said pair of corresponding common lines, two auxiliary bypassing transistors are operatively connected therebetween, one of said two auxiliary bypassing transistors being operatively connected between said corresponding data bit line pair.

9. A semiconductor memory circuit as set forth in claim 6, wherein said bypassing transistors are operatively connected between said corresponding data bus pairs and said auxiliary bypassing transistors are operatively connected between said corresponding bit line pairs.

10. A semiconductor memory circuit as set forth in claim 6, wherein said write control circuit comprises means for receiving a write-enable signal and an inverted write-enable signal, and wherein each of said auxiliary bypassing transistors comprises a field-effect transistor connected at its source and drain to said corresponding first and second common lines, respectively, and receives at its gate, said inverted write-enable signal, said inverted write-enable signal controlling said write-control circuit and indicating that a read operation should be conducted.

11. A semiconductor memory circuit as set forth in claim 6, wherein said auxiliary bypassing transistors conduct, in response to two successive read cycles, when one of said memory cells connected to one of said bit line pairs is accessed and during the next read cycle, another memory cell connected to said one of said bit line pairs is accessed.

* * * * *

UNITED STATES PATENT AND TRADEMARK OFFICE
CERTIFICATE OF CORRECTION

PATENT NO. : 4,402,066

DATED : August 30, 1983

INVENTOR(S) : Itoh et al

It is certified that error appears in the above-identified patent and that said Letters Patent is hereby corrected as shown below:

```
Column 1, line 30, After "will" insert --be--.
Column 2, line 55, "ADB" should be --ADB--.
Column 3, line 28, "symboles" should be --symbols--;

line 67, "IN" should be --IN--.

Column 4, line 38, "BL" should be --BL--;
          line 39, "ADB" should be --ADB--;
                   "DB" should be --DB--;

line 40, "BL" should be --BL--;
                   "ADB" should be --ADB--;
          line 41, "DB" should be --DB--.
Column 5, line 4,  "IN" should be --(IN)--;
          line 9,  "WE" should be --(WE)--;
          line 10, "WE" should be --(WE)--;
          line 11, "WE" should be --(WE)--;
```

UNITED STATES PATENT AND TRADEMARK OFFICE
CERTIFICATE OF CORRECTION

PATENT NO. : 4,402,066

DATED : August 30, 1983

INVENTOR(S) : Itoh et al.

Page 2 of 2

It is certified that error appears in the above-identified patent and that said Letters Patent is hereby corrected as shown below:

```
            line 21, "WE" should be --WE--;
            line 24, "WE" should be --WE--;
            line 65, "BL" should be --BL--.
  Column 6, line 5, "BL6" should be --BL6--;
            line 38, "SD" (second occurrence) should be --SD--.
  Column 7, line 2, "138" should be --"1"--;
            line 11, "IN" should be --IN--;
            line 21, "IN" should be --IN--;
            line 62, "WES" should be --WES--.
  Column 9, line 19, "busses" should be --buses--.
```

Signed and Sealed this

Fourteenth Day of August 1984

[SEAL]

Attest:

GERALD J. MOSSINGHOFF

Attesting Officer

Commissioner of Patents and Trademarks